United States Patent
Chong et al.

(10) Patent No.: US 7,572,712 B2
(45) Date of Patent: Aug. 11, 2009

(54) METHOD TO FORM SELECTIVE STRAINED SI USING LATERAL EPITAXY

(75) Inventors: Yung Fu Chong, Singapore (SG); Zhijiong Luo, Carmel, NY (US); Judson R. Holt, Wappingers Falls, NY (US)

(73) Assignees: Chartered Semiconductor Manufacturing, Ltd., Singapore (SG); International Business Machines Corporation (IBM), Armonk, NY (US)

( * ) Notice: Subject to any disclaimer, the term of this patent is extended or adjusted under 35 U.S.C. 154(b) by 167 days.

(21) Appl. No.: 11/561,982

(22) Filed: Nov. 21, 2006

(65) Prior Publication Data
US 2008/0116482 A1 May 22, 2008

(51) Int. Cl.
H01L 21/76 (2006.01)
(52) U.S. Cl. ............. 438/424; 438/433; 438/438; 257/217; 257/E21.549
(58) Field of Classification Search ......... 438/424, 438/433, 438; 257/217, E2.549
See application file for complete search history.

(56) References Cited

U.S. PATENT DOCUMENTS

| | | | |
|---|---|---|---|
| 6,274,913 B1 | 8/2001 | Brigham | |
| 6,563,152 B2 | 5/2003 | Roberds | |
| 6,690,043 B1 | 2/2004 | Usuda | |
| 6,717,216 B1 | 4/2004 | Doris | |
| 6,841,430 B2 | 1/2005 | Sugawara | |
| 6,884,667 B1 | 4/2005 | Doris | |
| 6,900,502 B2 | 5/2005 | Ge | |
| 7,364,975 B2 * | 4/2008 | Culmsee et al. | 438/296 |
| 2002/0074598 A1 | 6/2002 | Doyle | |
| 2002/0190344 A1 | 12/2002 | Michejda | |
| 2003/0022412 A1 * | 1/2003 | Higgins et al. | 438/50 |
| 2004/0026765 A1 | 2/2004 | Currie et al. | |
| 2004/0209479 A1 * | 10/2004 | Heo et al. | 438/720 |
| 2005/0051841 A1 * | 3/2005 | Leedy | 257/347 |
| 2005/0085022 A1 | 4/2005 | Chidambarrao | |
| 2005/0139929 A1 | 6/2005 | Rost | |
| 2005/0139930 A1 | 6/2005 | Chidambarrao | |
| 2005/0145837 A1 | 7/2005 | Chan | |
| 2007/0132056 A1 * | 6/2007 | Williams | 257/510 |
| 2007/0196996 A1 * | 8/2007 | Han et al. | 438/424 |

* cited by examiner

*Primary Examiner*—Phuc T Dang
(74) *Attorney, Agent, or Firm*—Horizon IP Pte Ltd

(57) ABSTRACT

Embodiments for FET devices with stress on the channel region by forming stressor regions under the source/drain regions or the channel region and forming a selective strained Si using lateral epitaxy over the stressor regions. In a first example embodiment, a lateral epitaxial layer is formed over a stressor region under a channel region of an FET. In a second example embodiment, a lateral S/D epitaxial layer is formed over S/D stressor region under the source/drain regions of an FET. In a third example embodiment, both PFET and NFET devices are formed. In the PFET device, a lateral S/D epitaxial layer is formed over S/D stressor region under the source/drain regions. In the NFET device, the lateral epitaxial layer is formed over a stressor region under a channel region of the NFET.

32 Claims, 13 Drawing Sheets

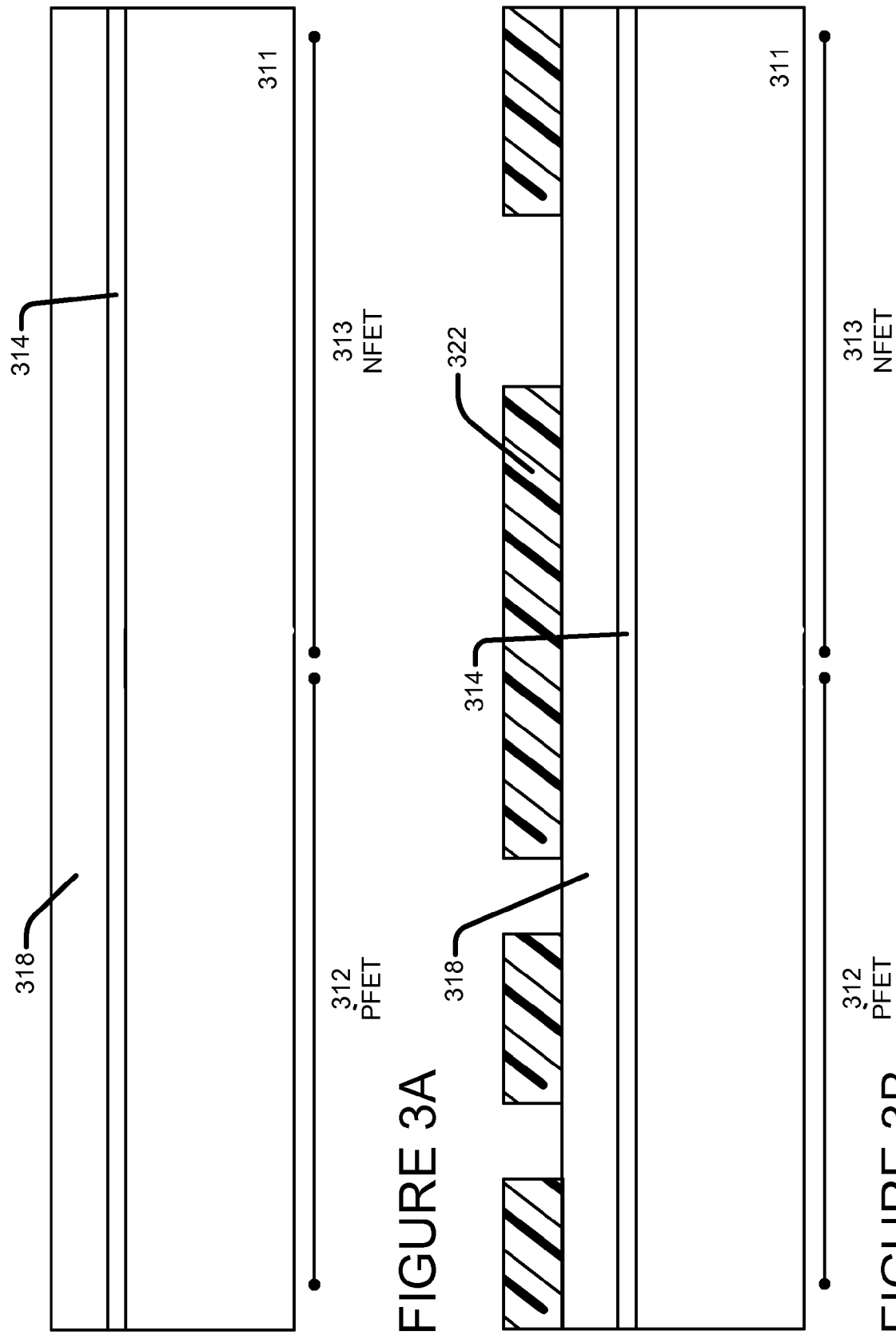

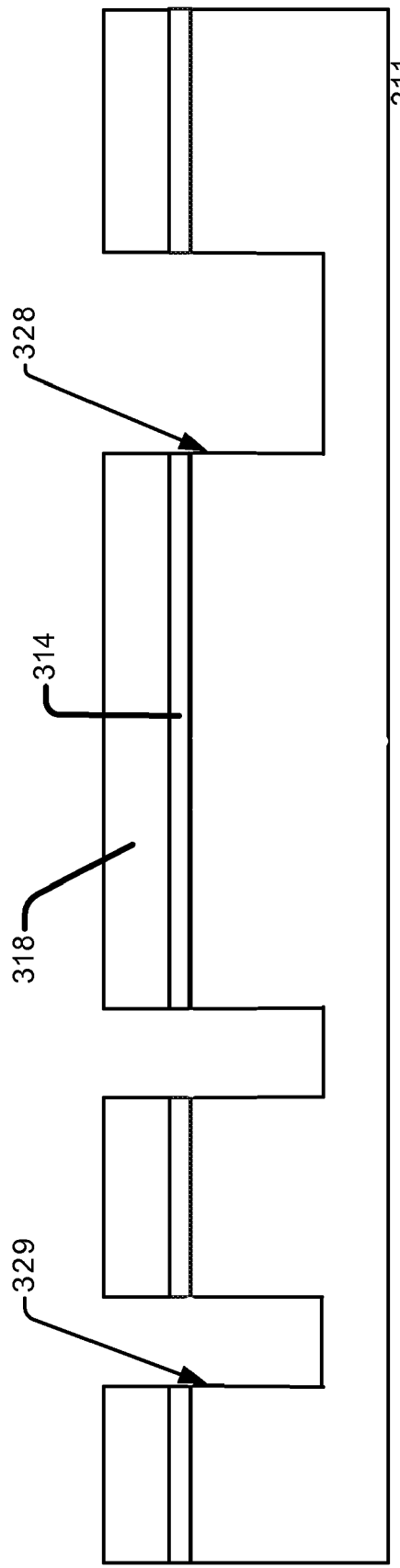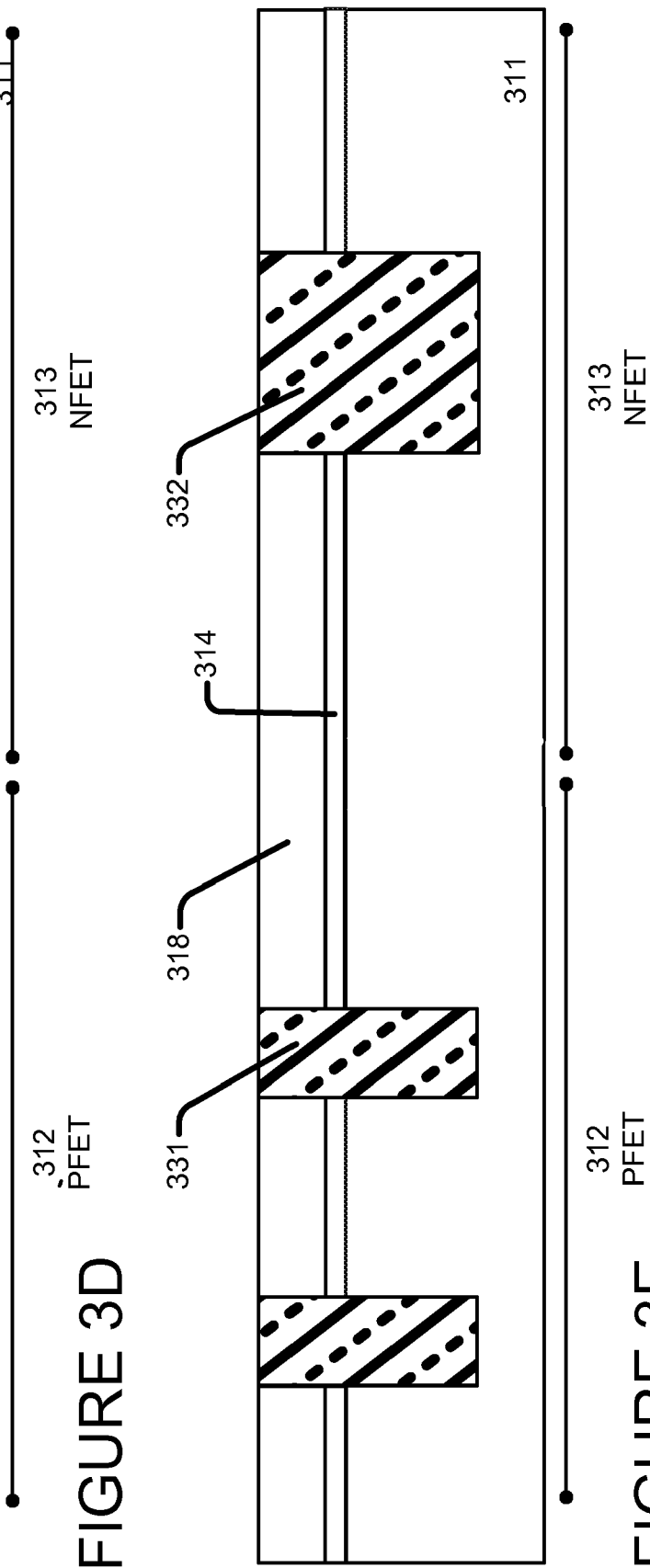

METHOD TO FORM SELECTIVE STRAINED SI USING LATERAL EPITAXY

BACKGROUND OF INVENTION

1) Field of the Invention

This invention relates generally to fabrication of field effect transistors (FET), such as CMOS transistors, and more particularly to a method for forming field effect transistors with stressed channel regions.

2) Description of the Prior Art

It is well established that the stress/strain in the silicon channel can affect the mobility of carriers significantly. For example, tensile longitudinal stress along the device channel improves the electron mobility while it degrades the hole mobility. Most of the methods to induce uniaxial stress in the device channel are such that they are beneficial to one type of transistor (for e.g. NFET), while it degrades the performance of the complementary transistor (in this case, PFET). Hence, one cannot use existing techniques which employ uniaxial stress to simultaneously improve both NFET and PFET device performance.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 6,717,216 and U.S. Pat. No. 6,884,667: Field effect transistor with stressed channel and method for making same—Inventor: Doris, Bruce B.

US20050085022A1 and US20050139930A1 Strained dislocation-free channels for CMOS and method of manufacture—Inventor: Chidambarrao, Dureseti.

US20050145837A1: Enhancement of electron and hole mobilities in <110> Si under biaxial compressive strain—Inventor: Chan, Victor.

U.S. Pat. No. 6,884,667: Field effect transistor with stressed channel and method for making same—Inventor: Doris, Bruce B.

US20050139929A1: Transistor design and layout for performance improvement with strain—Inventor: Rost, Timothy A.

U.S. Pat. No. 6,900,502: Strained channel on insulator device—Inventor: Ge, Chung-Hu.

U.S. Pat. No. 6,841,430: Semiconductor and fabrication method thereof—Inventor: Sugawara, Minoru.

US20040026765A1: Semiconductor devices having strained dual channel layers—Inventors: Currie et al.

U.S. Pat. No. 6,690,043: Semiconductor device and method of manufacturing the same—Inventor: Usuda, Koji.

US20020074598A1: Methodology for control of short channel effects in MOS transistors—Inventor: Doyle, Brian S.

U.S. Pat. No. 6,563,152: Technique to obtain high mobility channels in MOS transistors by forming a strain layer on an underside of a channel—Inventor: Roberds, Brian.

US20020190344A1: Semiconductor device having a ghost source/drain region and a method of manufacture therefor—Inventor: Michejda, John A.

U.S. Pat. No. 6,274,913: Shielded channel transistor structure with embedded source/drain junctions—Inventor: Brigham, Lawrence.

US20020074598A1: Methodology for control of short channel effects in MOS transistors-:—Inventor: Doyle, Brian S.

SUMMARY OF THE INVENTION

Some example embodiments of the present invention provide structures and methods of manufacturing field effect transistors with stressed channel regions which are characterized as follows.

A first example method embodiment for a method of fabricating a semiconductor device comprising the steps of:
  forming a trench in a substrate;
  forming a stressor region at least partially filling the trench with a stressor material;
  forming an epitaxial layer over the stressor region using a lateral epitaxial process;
  forming a transistor over the epitaxial layer; the transistor comprised of a channel region, a source region, a drain region and a gate electrode; stressor region creating a stress on the channel region.

A first example device embodiment for a field effect transistor is comprised of:
  a gate electrode disposed over a channel region; the channel region at least partially in an epitaxial layer; the epitaxial layer is over a stressor region in a substrate under the gate electrode;
  the source/drain regions are adjacent to the gate electrode over the substrate;
  whereby the stressor region puts a stress on the channel region.

A second example method embodiment for a method of fabricating a semiconductor device comprising the steps of:
  forming S/D trenches in a substrate in a S/D area where source/drain regions will be subsequently formed;
  forming S/D stressor regions at least partially filling the S/D trenches with a stressor material;
  forming S/D epitaxial layers over the S/D stressor regions using a lateral epitaxial process;
  forming a transistor over the substrate; the transistor comprised of a channel region, a source/drain regions, a gate dielectric and a gate electrode.

A second example device embodiment for a field effect transistor is comprised of:
  a gate electrode disposed over a substrate; a channel region in the substrate under the gate electrode;
  source-drain trenches in the substrate adjacent to the gate electrode;
  S/D stressor regions at least partially filling the source-drain trenches; the S/D stressor regions comprised of a stressor material;
  a S/D epitaxial layer over the S/D stressor regions;
  the source/drain regions adjacent to the gate electrode and can be at least partly in the S/D epitaxial layer.

Third example method and device embodiments comprise forming stressor regions under the S/D region of a first transistor and under the channel of a second transistor.

In the third and fourth example device embodiments, the semiconductor device comprises:
  a substrate having a first region and second region; a first FET is in the first region;
  a second FET is in the second region;
  first S/D trenches in the first region and a second channel trench in the second region;
  first S/D stressor regions at least partially filling the first S/D trenches with stressor material; and a second channel stressor region at least partially filling the second channel trench with stressor material;
  a first S/D epitaxial layer over the first S/D stressor regions and a second channel epitaxial layer over the second channel stressor region;

a first FET in the first region over the substrate; the first FET is comprised of a first channel region, first source/drain regions, a first gate dielectric and a first gate electrode; the first source/drain regions are at least partly in the first S/D epitaxial layer; and a second FET over the second region; the second FET is comprised of a second channel region, second source/drain regions, a second gate dielectric and a second gate electrode.

In an aspect of the above embodiment, the semiconductor device further comprises:

the first FET is a PFET and the second FET is a NFET;

the first S/D stressor regions have a compressive stress and the S/D stressor regions provide a compressive stress to the first channel region;

the second channel stressor region has a compressive stress and the second channel stressor region provides a tensile stress to the second channel epitaxial layer in the second channel region.

In an aspect of the above example embodiments, the semiconductor device further comprises:

the first FET is a NFET and the second FET is a PFET;

the first S/D stressor regions and the second channel stressor region have a tensile stress;

the S/D stressor regions provide a tensile stress to an area the first channel region;

and the second channel stressor region provides a compressive stress to the second channel region.

In a example third embodiment, the semiconductor device comprises:

a substrate having a PFET region and NFET region; a PFET is in the PFET region; a NFET is in the NFET region;

PFET S/D trenches in the PFET region and a NFET channel trench in the NFET region;

PFET S/D stressor regions at least partially filling the PFET S/D trenches with stressor material; and a NFET channel stressor region at least partially filling the NFET channel trench with stressor material;

a PFET S/D epitaxial layer over the PFET S/D stressor regions and a NFET channel epitaxial layer over the NFET channel stressor region;

a PFET in the PFET region over the substrate; the PFET is comprised of a PFET channel region, PFET source/drain regions, a PFET gate dielectric and a PFET gate electrode; the PFET source/drain regions are at least partly in the PFET S/D epitaxial layer; and a NFET over the NFET region; the NFET comprised of a NFET channel region, NFET source/drain regions, a NFET gate dielectric and a NFET gate electrode; the NFET channel region is at least partly in the NFET channel epitaxial layer.

In an aspect of the above example embodiments, the semiconductor device of further comprises:

the PFET S/D stressor regions have a compressive stress and the S/D stressor regions provide a compressive stress to an area in the PFET channel region;

the NFET channel stressor region has a compressive stress and the NFET channel stressor region provides a tensile stress to the NFET channel epitaxial layer in the NFET channel region.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 3A, 3B, 3C, 3D, 3E, 3F, 3G, and 3H are cross sectional views for illustrating a method for manufacturing a FET according to a third example embodiment of the present invention.

FIG. 4 shows a cross sectional view for illustrating a device and method for manufacturing an FET according to a fourth example embodiment of the present invention.

DETAILED DESCRIPTION OF THE EXAMPLE EMBODIMENTS

I. Overview—Example Embodiments—Lateral Epitaxial Growth Over Stressor Regions to Put Stress on FET Channels In a first example embodiment, a lateral epitaxial layer is formed over a stressor region under a channel region of a FET.

In a second example embodiment, a lateral S/D epitaxial layer is formed over S/D stressor region under the source/drain regions of an FET.

In a third example embodiment, both PFET and NFET devices are formed. In the PFET device, lateral S/D epitaxial layers are formed over S/D stressor regions under the source/drain regions. In the NFET device, the lateral epitaxial layer is formed over a stressor region under a channel region of the NFET.

II. First Example Embodiment—Lateral Epitaxy Over Channel Stressor Region

A first example embodiment is shown in FIGS. 1A to 1H. In the first example embodiment, we form a lateral epitaxial layer 38 over a channel stressor region 32A. Depending on the type of FET formed (NFET or PFET), the channel stressor region 32A can be compressive or tensile.

Form a Trench in a Substrate

Figure 1A:
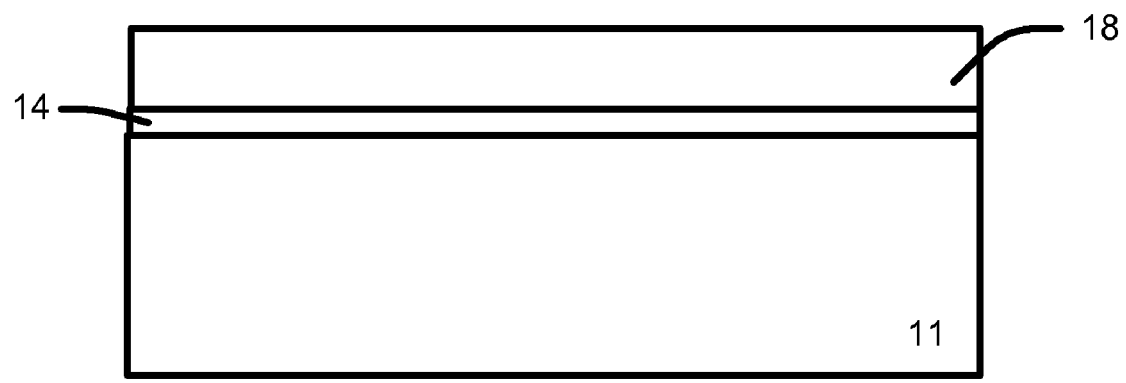
FIGS. 1A, 1B, 1C, 1D, 1E, 1F-1, 1F-2, 1F-3, 1F-4, 1G, and 1H are cross sectional views for illustrating a method for manufacturing an FET according to a first example embodiment of the present invention.

As shown in FIG. 1A, we provide a substrate 11. The substrate 11 can be a Si substrate with crystal orientation of (110) or (100) or (111), a SiGe substrate, or a SOI substrate. The substrate can be any substrate that a lateral epitaxial (semiconductor) layer can be grown on. The substrate can comprised a structure having a top Si containing layer that the lateral epitaxial layer can be grown on.

One option for all embodiments in this invention is to use a substrate that has an active region comprised of (110) Si. For epitaxial layer grown on (110) Si, it is thought that under proper conditions epitaxial layers can be grown so that the lateral epitaxial growth rate is more than twice the vertical epitaxial growth rate.

A example method to form the trench is shown in FIGS. 1A to 1D. Referring to FIG. 1A, we form a masking layer (e.g., 14 18) with a channel mask opening over the substrate. The masking layer can be formed of one or more layers. For example we can form a masking layer comprised of a pad oxide layer 14 and a nitride layer 18 over the substrate.

Figure 1B:
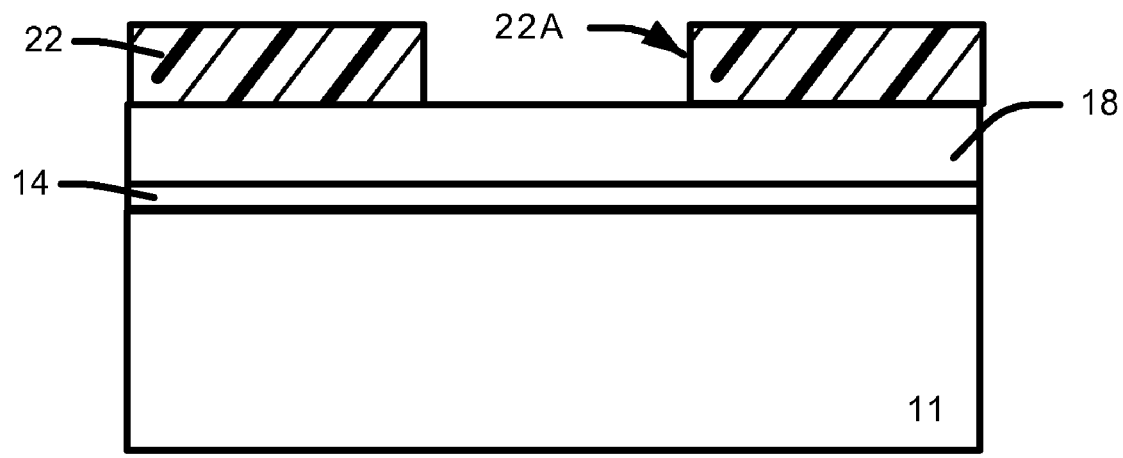
Figure 1C:
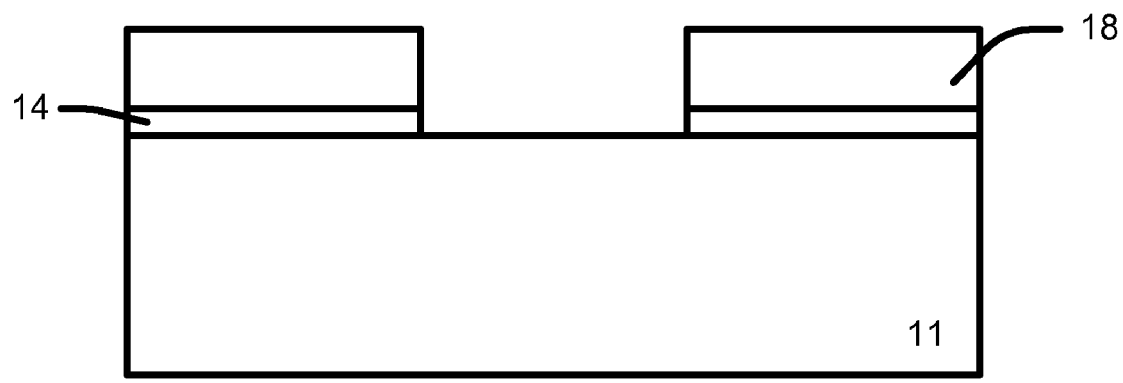

Referring to FIG. 1B, we can form a resist layer 22 with an opening 22A over the masking layer 14 18. As shown in FIG. 1C, we pattern the masking layer 14 18 using an etch process to form a channel mask opening. We then remove the resist layer.

Figure 1D:
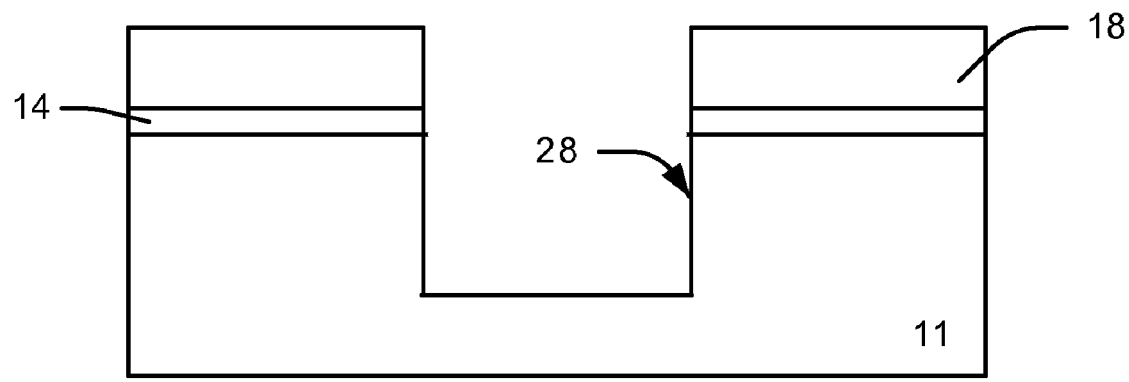

As shown in FIG. 1D, we form a channel trench 28 using the masking layer 14 18 as an etch mask. The trench 28 is in an area where a subsequently formed channel region of an FET device is located.

Form a Stressor Region

Figure 1E:
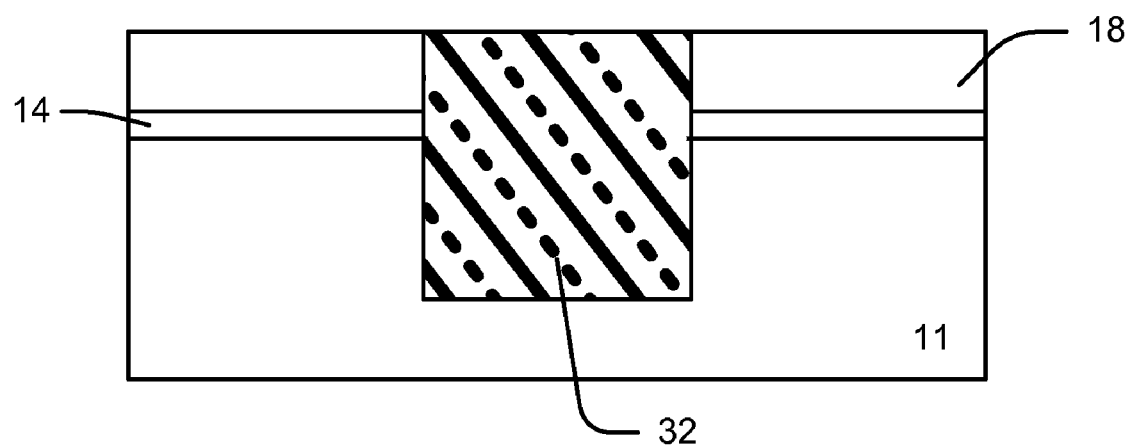
Figures 1, 1F:
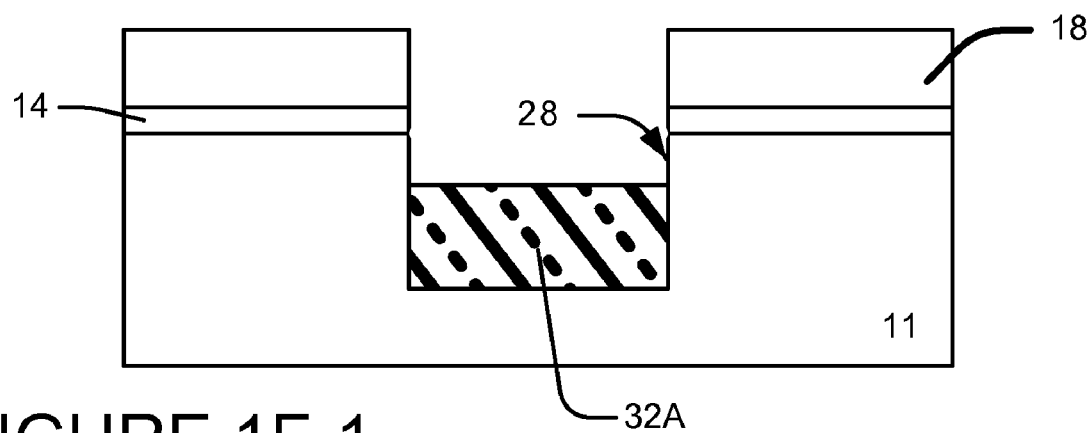
Figures 1, 1F, 2:
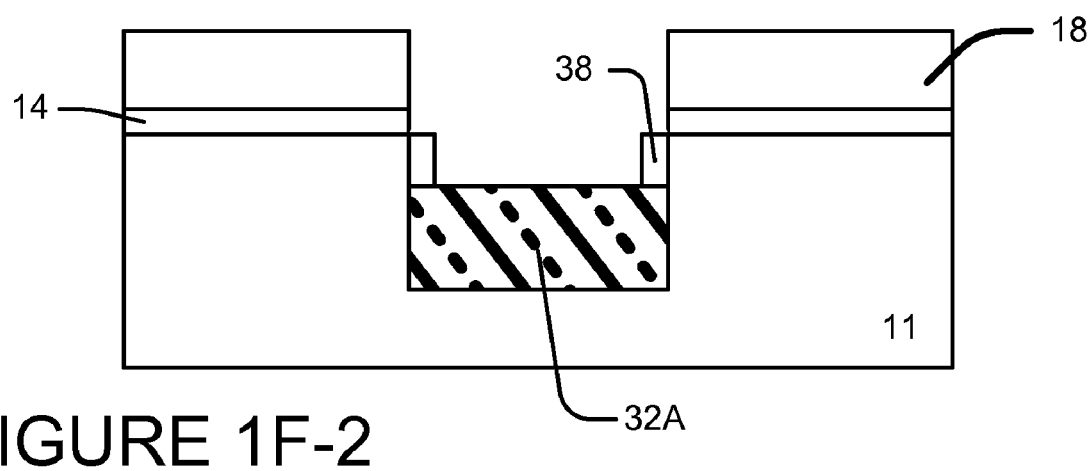
Figures 1, 1F, 2, 3:
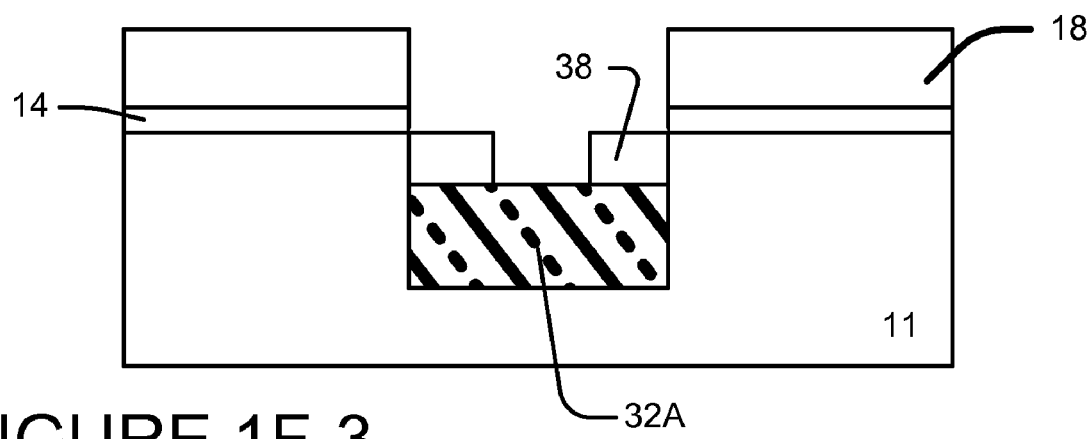

Referring to FIGS. 1E and 1F-1, we at least partially fill the trench 28 with a stressor material to form a stressor region 32A.

As shown in FIG. 1E, we can fill the trench 28 with a stressor material. This can be followed by Chemical Mechanical Polishing (CMP) to form a planar structure. As shown in FIG. 1F-1, we can etch back the stress material to form stressor region 32A.

The stressor region 32A is preferably comprised of an insulator material or dielectric material, such as silicon oxide, silicon oxynitride (SiON), or silicon nitride; or can be formed of other stress inducing materials. The stressor material can be tensile or compressive material depending on the process used in formation and the desired resultant stress. The stressor region can be formed using a chemical vapor deposition process or an oxidation process, such as oxidation of polysilicon. The stressor can be comprise of a tensile or compress oxide or nitride. As will be discussed below the stressor region can be compressive or tensile. The stressor region is preferably comprised of a material that substantially does not allow, or allow only a small amount of vertical epitaxial layer to grow on the stressor region.

Form an Epitaxial Layer Over the Stressor Region

As shown in FIGS. 1F-1, 1F-2, 1F-3, 1F-4 and 1G, we form an epitaxial (e.g., semiconductor) layer 38 over the stressor region 32A using a lateral epitaxy process. FIGS. 1F-2, 1F-3, and 1F-4 show stages of the lateral growth of the epitaxial layer 38. Since the buried stressor is an dielectric or insulator, there can be essentially no epitaxial growth from the vertical direction. After this, a high temperature anneal may be performed to ensure good crystal quality.

The epitaxial layer 38 can be comprised of a semiconductor material, Si, C doped Si, SiGe, and is most preferably substantially comprised of Si. The epitaxial layer 38 is preferably comprised of Si and preferably that does not produce stress. Preferably, the buried (insulator) structures produce the stress, and not the semiconductor layer 38.

The lateral epitaxy layer is preferably formed using a lateral epitaxial growth process that can have lateral growth about 90 to 100% of the total growth (e.g., Vertical growth is between about 0 to 10% of the total growth). The ratio between the vertical growth rate and the lateral growth rates can be between 0:1 and 0.2:1 and preferably between 0:1 and 0.1:1. The lateral epitaxy layer can grow substantially laterally from the sidewalls of the substrate 11 in the trenches.

Under normal circumstances, the epitaxial lateral growth is equal in the x and y directions. However, it is also possible to have different lateral growth rate in the x and y directions, depending on the surrounding features/structures.

The lateral epitaxy provides the unique characteristics to form lateral epitaxial layers over buried (insulator) structures. In contrast, vertical epitaxy cannot form over buried structures. In vertical epitaxy, we need a seed layer to grow from the bottom upwards, but in lateral epitaxy, the seed layer grows about mostly from the sidewalls.

The lateral epitaxial layer 38 itself normally does not induce stress. The underlying (buried insulator) stressor layer 32A can produces a stress on the epitaxial layer 38 and thereby on the channel (that maybe in the epitaxial layer). The stress (e.g. compressive or tensile) of the underlying buried insulator layer (stressor region 32A) determines the stress on the channel region.

The lateral epitaxial layer can increase/decrease the channel stress in more than one direction. However, the response of the device to the resultant stress is usually dominant in only one direction.

The lateral epitaxial layer can be formed using processes such as: rapid thermal chemical vapor deposition, ultra-high vacuum chemical vapor deposition, or molecular beam epitaxy. An example lateral epitaxy process for forming the Si lateral epitaxial layer comprised substantially of Si comprises: flowing gases: $H_2$, HCl and Dichlorosilane (DCS), at a flow rate between 20 and 200 sccm; at a temperature between 500 and 900 C; at a pressure between 5 and 60 Torr; for a duration between 2 and 30 min.

The lateral epitaxial layer can provide some of the following features over a vertically grown epitaxial layer: a lateral epitaxy provides the unique characteristics to form buried (insulator) structures whereas vertical epitaxy normally cannot form buried structures.

An high temperature anneal can be performed some time after the epitaxial layer is formed to ensure good crystal quality in the epitaxial layer.

Form a Transistor Over the Epitaxial Layer

Figures 1, 1F, 2, 3, 4:
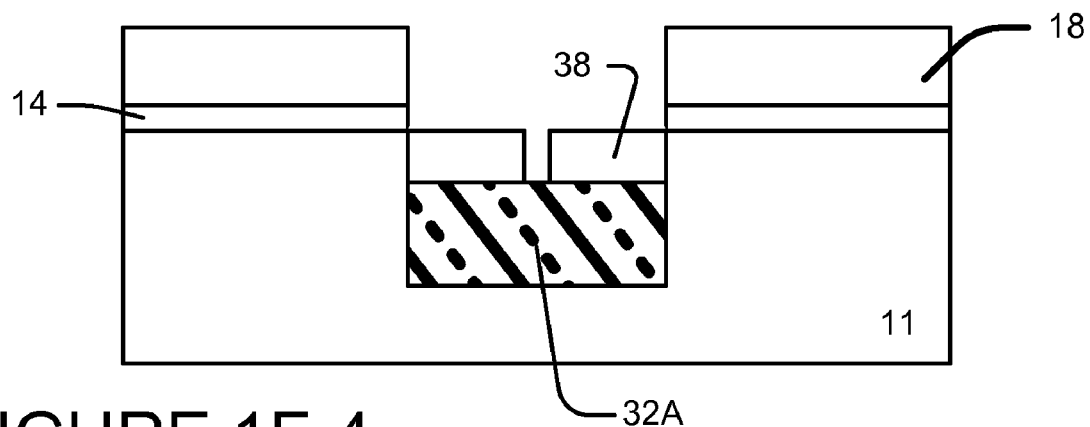
Figure 1G:
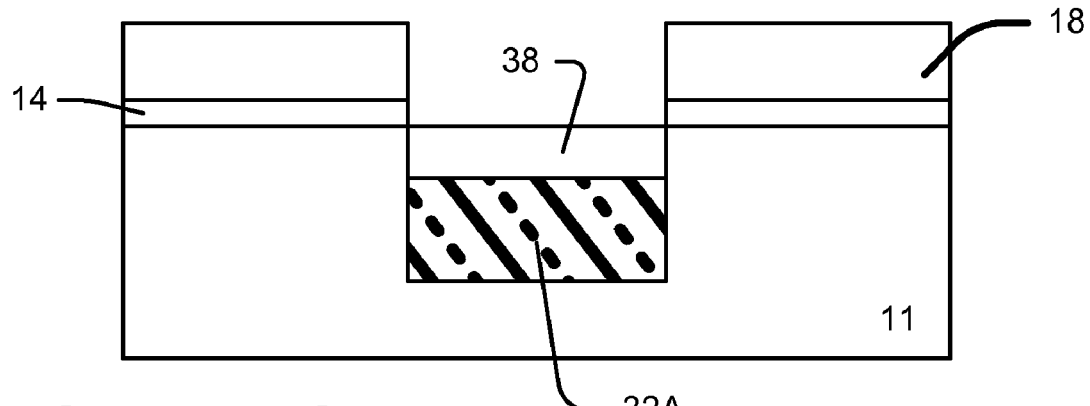
Figure 1H:
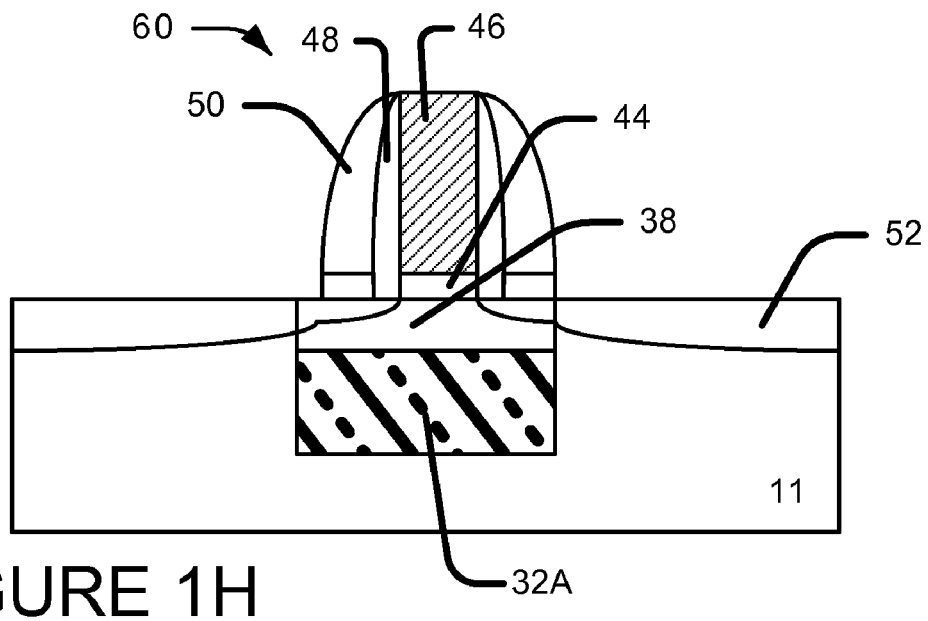

Referring to FIG. 1H, we form at least a portion of the FET 60 over the epitaxial channel layer 38. The FET can be comprised of source and drain regions 52, a gate dielectric 44, a gate electrode 46, a channel region (under the gate and between the source and drain regions), first spacers 48 and second spacers 50. The FET device may not be in completed form and may have additional elements.

The FET is a PFET

In the case where the field effect transistor (FET) is a PFET, the stressor region 32A has a tensile stress. The net effect of stressor region 32A is that it provides a longitudinal compressive stress to the epitaxial layer 38 and the channel region of the PFET. The longitudinal direction is between the source region and the drain region. Longitudinal is the direction that current flows in the channel. Longitudinal is the direction parallel with the channel width. Preferably, the longitudinal stress provided by the stressor and the lateral epitaxial layer is substantially along only one axis.

The FET is a NFET

In the option where the FET is a NFET, the stressor region 32A has a compressive stress. The net effect of stressor region 32A provides a longitudinal tensile stress to the epitaxial layer 38 and to the channel region of the NFET. Preferably, the longitudinal tensile stress provided by the stressor and the lateral epitaxial layer is essentially along only one axis.

The table below summaries the stresses.

TABLE

Stresses

|  | PFET | NFET |
|---|---|---|
| Stress of stressor region 32A | Tensile | Compressive |
| Stress in channel region | Longitudinal compressive stress | Longitudinal tensile stress |

III. Second Embodiment—S/D Stressor Region and Lateral Epitaxial Over S/D Stressor In a second example embodiment, as shown in FIGS. 2A to 2H, a lateral S/D epitaxial layer 239 is formed over S/D stressor regions 231A under the source/drain regions 252 of an FET 260.

For comparable steps (common process steps, processes, materials, parameters, etc) to the above example will not be describe in detail to avoid repetition.

Form S/D Trenches in a Substrate in a S/D Region

In an example shown in FIGS. 2A to 2D we form S/D trenches 229 in a substrate 211 in a S/D region where source/drain regions will be subsequently formed.

We form a masking layer (e.g., 214 218) with an S/D mask opening over the substrate. For example we can form a pad oxide layer 214 and a nitride layer 218 over the substrate.

Figure 2A:
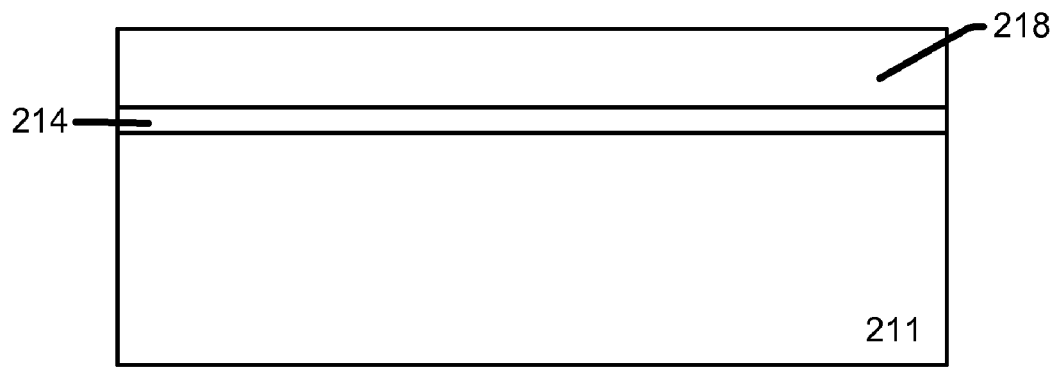
FIGS. 2A, 2B, 2C, 2D, 2E, 2F, 2G, and 2H are cross sectional views for illustrating a method for manufacturing an FET according to a third example embodiment of the present invention.
Figure 2B:
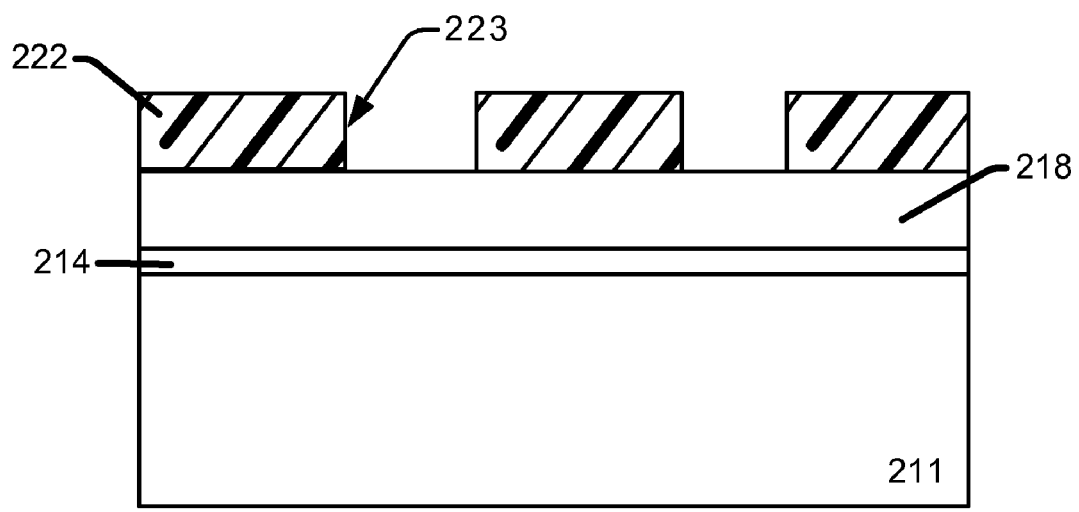

Referring to FIG. 2B, we can form a resist layer 222 with openings 223 over the masking layer 214 218.

Figure 2C:
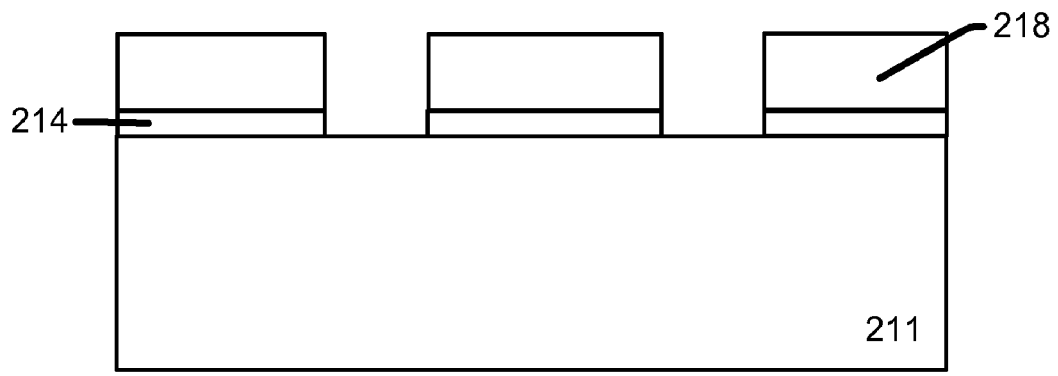

As shown in FIG. 2C, we pattern the masking layer 214 218 using an etch process to form S/D mask openings. We then remove the resist layer.

Figure 2D:
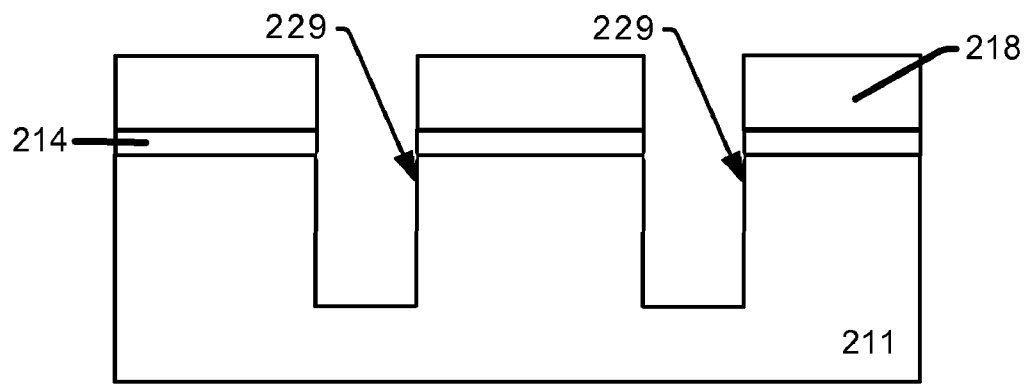

As shown in FIG. 2D, we form S/D trenches 229 in the substrate 211 using the masking layer 214 218 as an etch mask.

Form S/D Stressor Regions

Figure 2E:
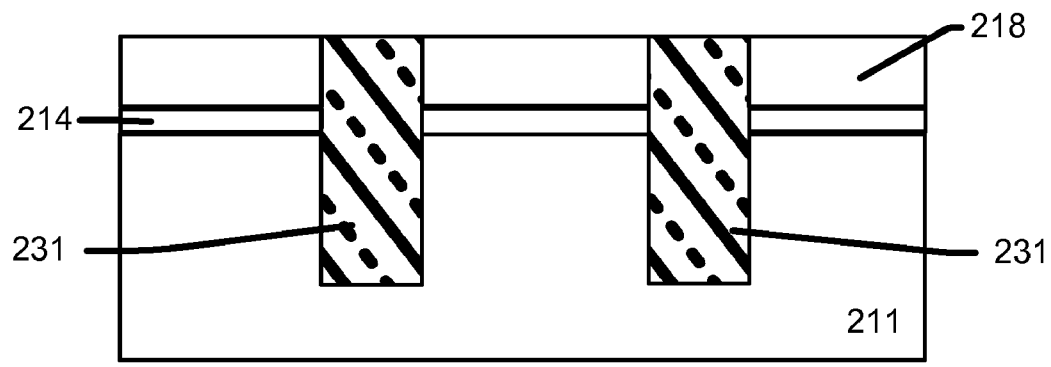
Figure 2F:
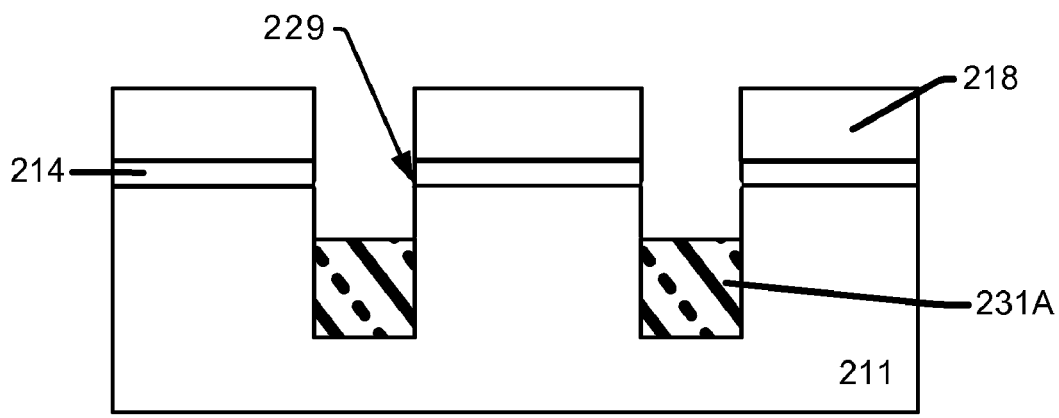

As shown in FIG. 2F we form outboard stressor regions 231A. We at least partially fill the S/D trenches 229 with a stressor material (e.g., insulator) to form S/D stressor regions 231A. The stressor regions can be formed as described above.

One way to form the stressor regions is shown in FIGS. 2E and 2F. As shown in FIG. 2E, we can fill the trench 229 with a stressor material 231. As shown in FIG. 2F, we can etch back the stress material to form stressor region 231A.

Form a S/D Epitaxial Layer Over the S/D Stressor Regions

Figure 2G:
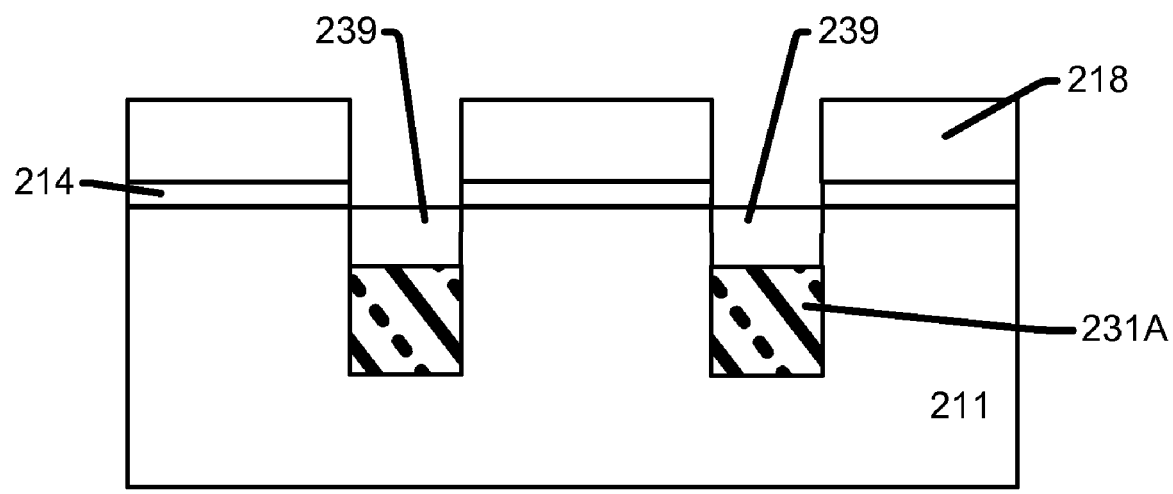

As shown in FIG. 2G, we form a S/D epitaxial (semiconductor) layer 239 over the S/D stressor regions 231A using a lateral epitaxial process. The lateral epitaxial layer can be formed as described above in the first example embodiment.

Form a FET

Figure 2H:
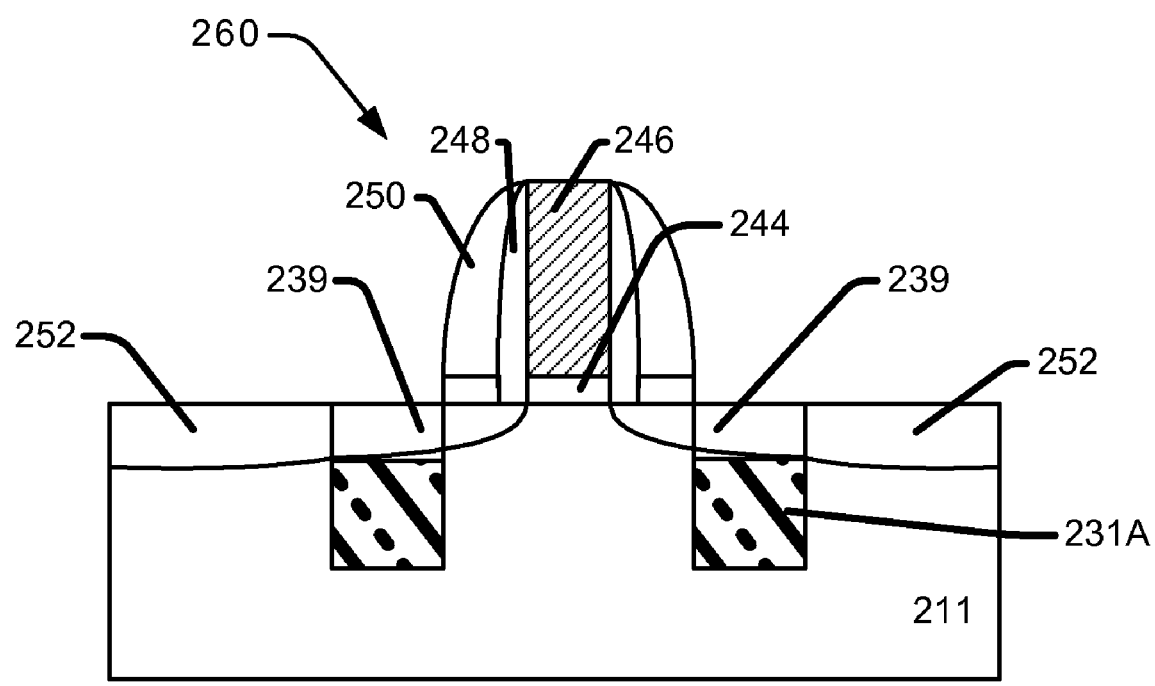

Referring to FIG. 2H, we form a FET 260 over the substrate. The FET 260 can be comprised of a channel region, source/drain regions 252, a gate dielectric 244, a gate electrode 246, first spacers 248 and second spacers 250. The source/drain regions 252 can be least partly in the S/D epitaxial layer 239.

In the option where the FET is a PFET and the S/D stressor regions 231A have a compressive stress and the S/D stressor region 231A provides a longitudinal compressive stress to the channel region. The longitudinal compressive stress is in the direction between the source region and the drain region (e.g., along the width of the channel).

In the option where the FET is a NFET and the stressor regions 231A have a tensile stress and the stressor region 231A provides a longitudinal tensile stress to the channel region of the NFET.

The table below summarizes the stresses:

TABLE $2^{nd}$ embodiment - S/D stressors

|  | PFET | NFET |
|---|---|---|
| Stress of S/D stressor regions 231A | Compressive | Tensile |
| Stress in channel region | Longitudinal compressive stress | Longitudinal tensile stress |

It is noted that the order of the steps can be changed. For example the gate structure (possibly including spacers) can be formed and then the S/D trenches etched.

IV. Third Example Embodiment—Both PFET and NFET Devices—Stressor Regions are Compressive In a third example embodiment, both PFET and NFET devices are formed. In the PFET device, a lateral S/D epitaxial layer is formed over S/D stressor region under the source/drain regions. In the NFET device, the lateral epitaxial layer is formed over a stressor region under a channel region of the NFET. The elements can be formed as described above in the first and second embodiments.

PFET Region and NFET Region

Referring to FIG. 3A, provide a substrate 311 having a PFET region 312 and NFET region 313. A PFET device will be formed in the PFET region 312. A NFET device will be formed in the NFET region 313.

The substrate 311 can be a (110) Si substrate, (100) Si substrate, (111) Si substrate, SiGe substrate, or a SOI substrate or other suitable substrate structure.

Form PFET S/D Trenches in the PFET Region and Forming a NFET Channel Trench in the NFET Region An example process is shown in FIGS. 3A to 3D to form PFET S/D trenches 329 in the PFET region and forming a NFET channel trench 328 in the NFET region 313.

As shown in FIG. 3A, we form a masking layer (e.g., 314 318) with a PFET S/D mask openings and NFET channel openings over the substrate.

Figure 3C:
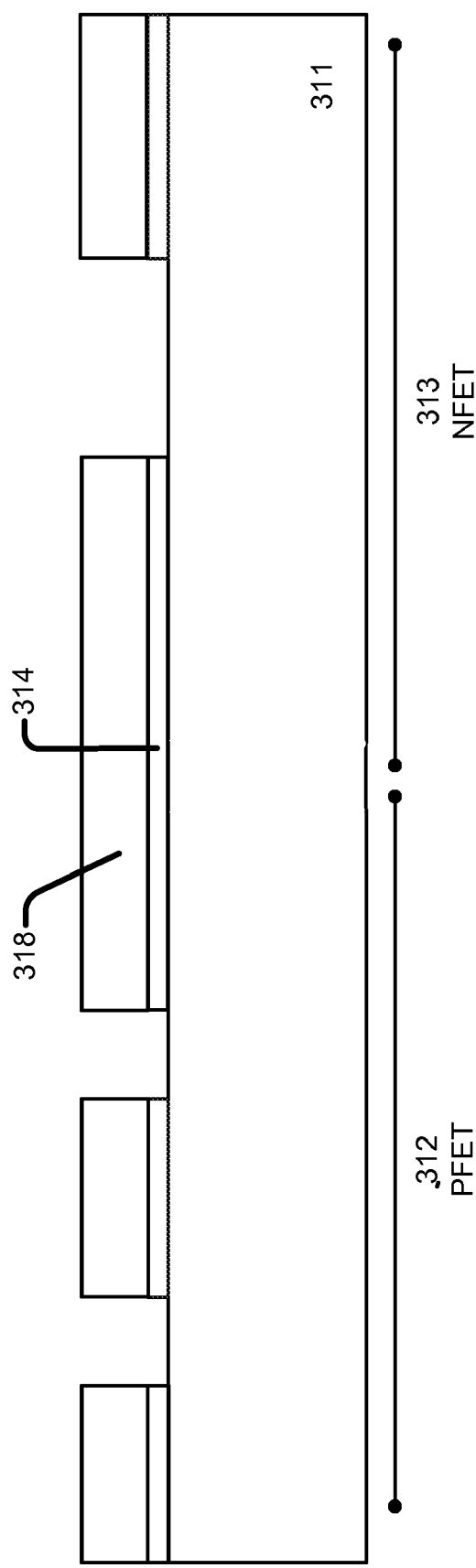

Referring to FIG. 3B, we can form a resist layer 322 with openings over the masking layer 314 318. As shown in FIG. 3C, we pattern the masking layer 314 318 using an etch process to form PFET S/D mask openings and NFET channel mask opening. We then remove the resist layer.

As shown in FIG. 3D, we form a PFET S/D trenches 329 in the PFET region 312 and a NFET channel trench 328 in the NFET region 313 using the masking layer 314 318 as an etch mask.

Form PFET S/D Stressor regions and a NFET Channel Stressor Region

We at least partially fill the PFET S/D trenches 329 with stressor material to form PFET S/D stressor regions 331A and at least partially filling the NFET channel trench 328 with stressor material to form a NFET channel stressor region 332A.

Preferably, the stressor material is an insulator. For example, the stressor can be comprise of oxide, silicon oxynitride or nitride. In this example embodiment, the stressor material has a compressive stress.

Figure 3F:
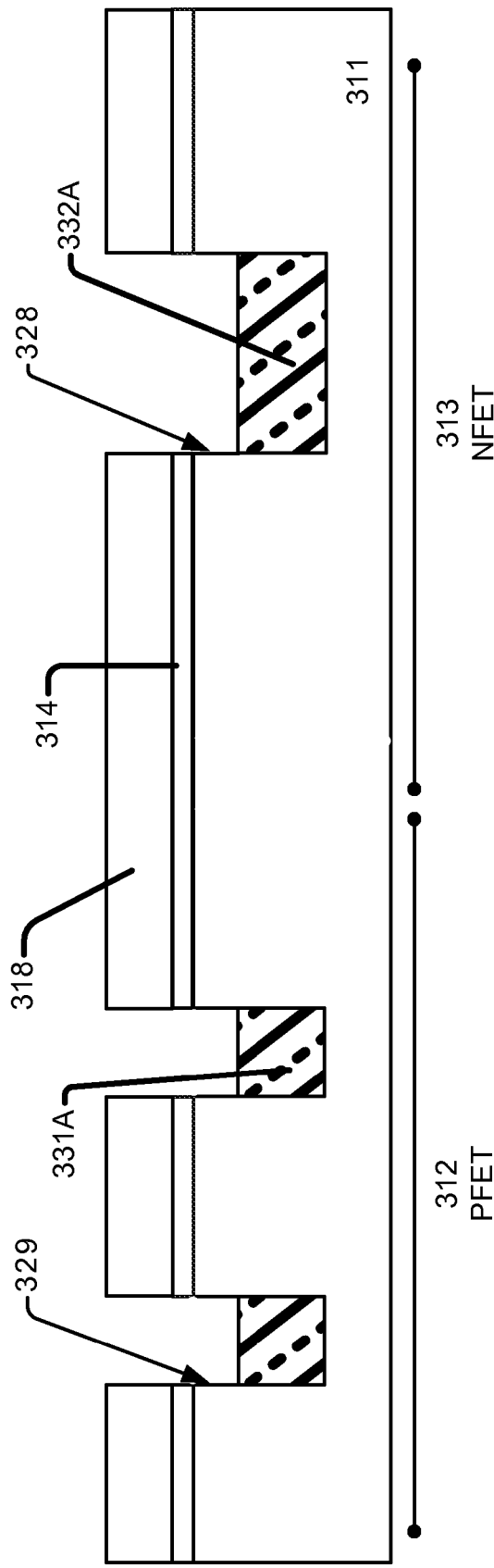

An example process is shown in FIGS. 3E and 3F. FIG. 3F shows the filling of the PFET S/D trenches 329 with stressor material and the filling of the NFET channel trench 328 with stressor material. The stressor material can be chemical-mechanical polished (CMP).

Next, as shown in FIG. 3F, the stressor material is etched back.

In this example, the stressor material has a compressive stress.

In an alternation (4$^{th}$) embodiment, the stressor material has a tensile stress and a NFET is formed over region 312 and a PFET is formed over region 313.

Figure 3G:
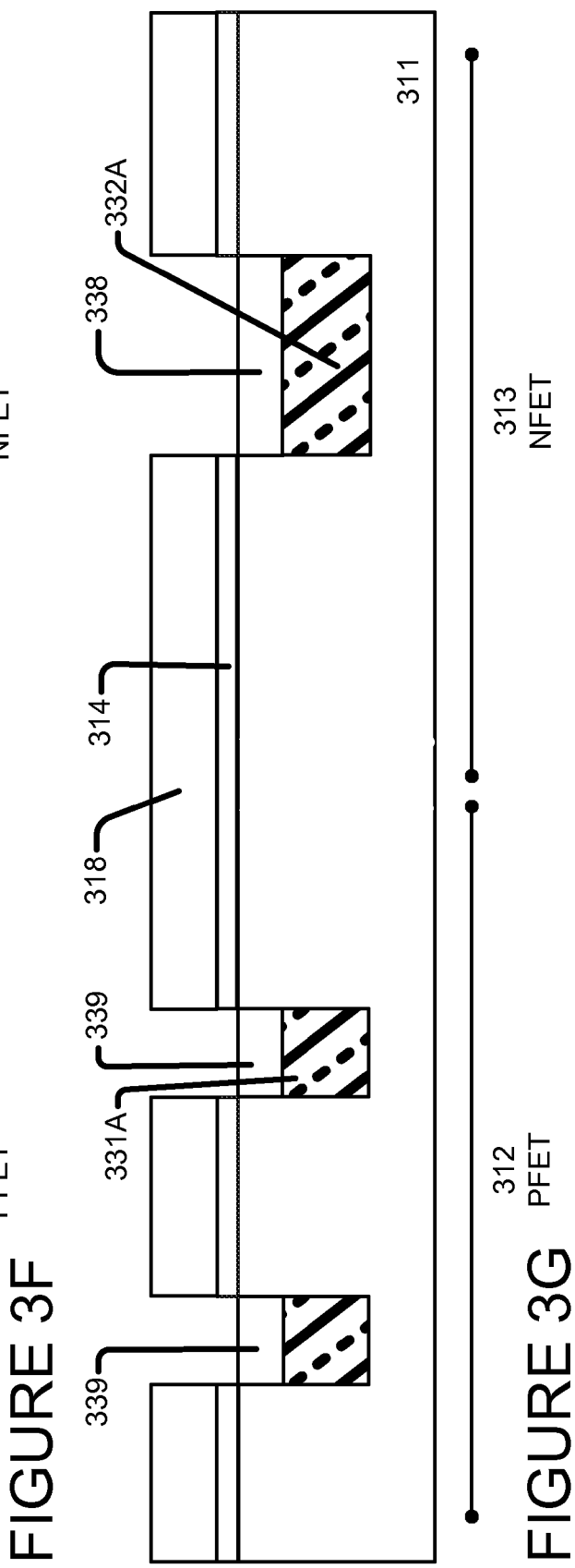

Form a PFET S/D Epitaxial Layer Over the PFET S/D Stressor Regions and Form a NFET Channel Epitaxial Layer Over the NFET Channel Stressor Region As shown in FIG. 3G we form a PFET S/D epitaxial layer 339 over the PFET S/D stressor regions 331A and form a NFET channel epitaxial layer 338 over the NFET channel stressor region 332A. The PFET S/D epitaxial layer 339 and the NFET channel epitaxial layer 338 are preferably formed using a lateral epitaxial process.

Form a PFET in the PFET Region and Form a NFET Over the NFET Region

Figure 3H:
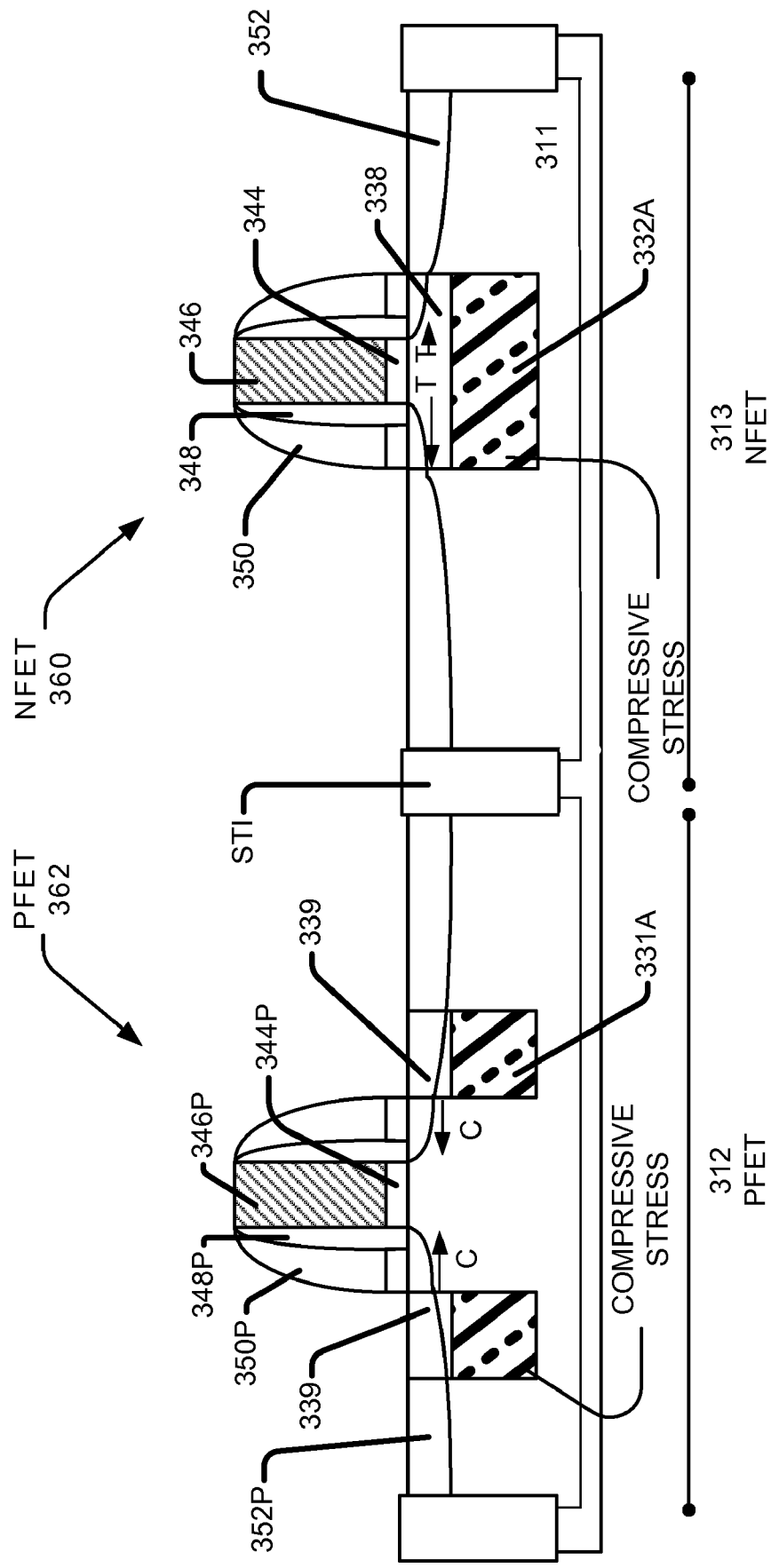
Figure 4:
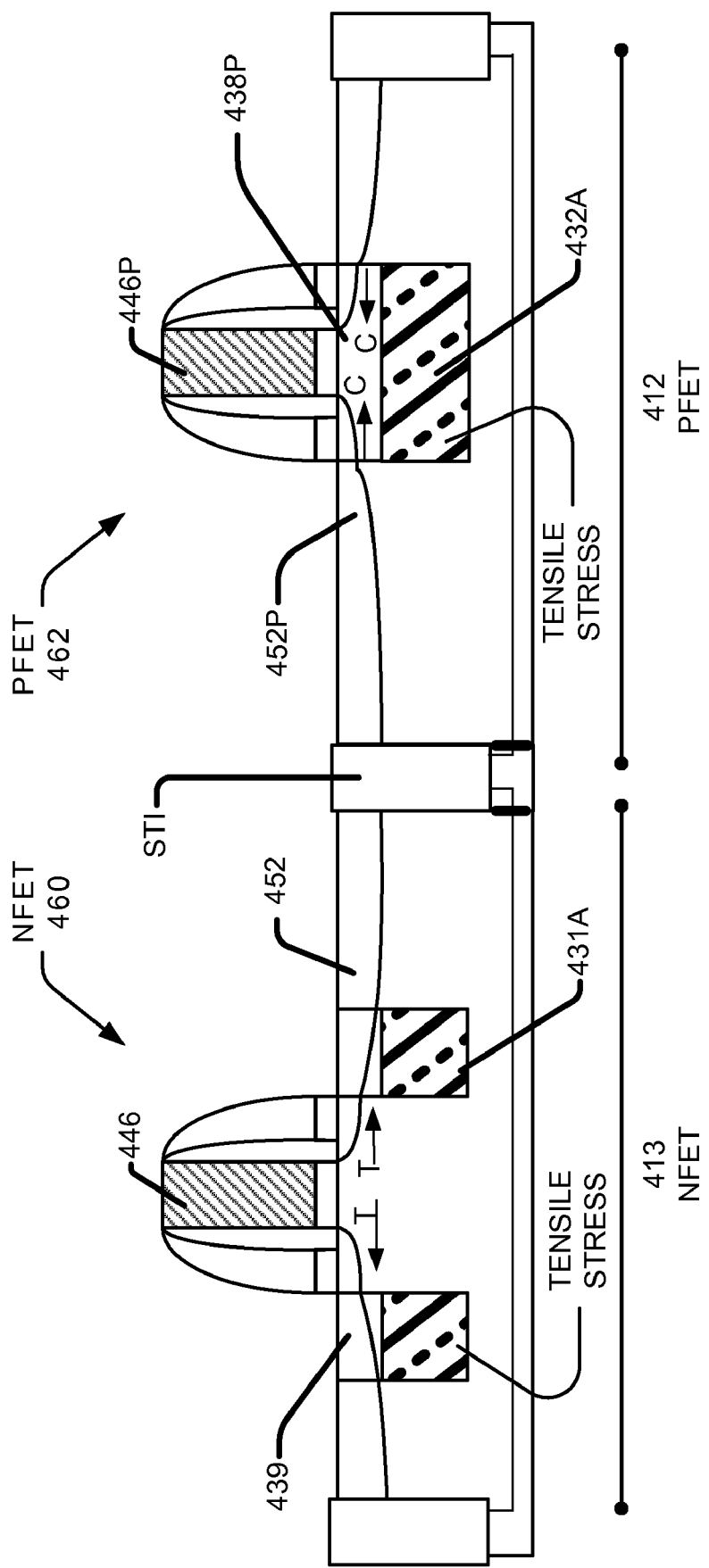

Referring to FIG. 3H, we form a PFET in the PFET region 312 over the substrate. An example of the PFET is PFET 362 that can be comprised of a PFET channel region, PFET source/drain regions 352P, a PFET gate dielectric 344P and a PFET gate electrode 346P; (first PFET spacer 348P and second PFET spacer 350P) the PFET source/drain regions 352P are at least partly in the PFET S/D epitaxial layer 339.

We also can form a NFET 360 over the NFET region 313. The NFET 360 can be comprised of a NFET channel region, NFET source/drain regions 352, a NFET gate dielectric 344 and a NFET gate electrode 346 (first NFET spacer 348 and second NFET spacer 350). The NFET channel region can be above or at least partly in the NFET channel epitaxial layer 338.

The PFET S/D stressor regions 331A have a compressive stress and the S/D stressor regions 331A provide a longitudinal compressive stress (represented by arrows C in FIG. 3H) to the PFET channel region.

The NFET channel stressor region 332A has a compressive stress and the NFET channel stressor region 332A provides a longitudinal tensile stress (represented by arrows T in FIG. 3H) to the NFET channel region.

V. Fourth Example Embodiment—Stressor Regions are Tensile Stress

FIG. 4 shows the example embodiment where tensile stressor regions 431A and 432A are formed. The fourth example embodiment can be made using a process similar to the third example embodiment.

The S/D stressors 431A are formed under the NFET S/D regions 452 in the NFET region 413. The tensile stress S/D stressor regions 431A provide a longitudinal tensile stress (T) to the NFET channel region. The NFET 460 is comprised of the gate 446, S/D 452, lateral epitaxial layer 439, and channel region under the gate.

The channel stressor 432A is formed under the PFET gate 446P in the PFET region 412. The channel stressor region 432A has a tensile stress. The channel stressor region 432A provides a longitudinal compressive stress (C) to the epitaxial layer 438P and to the PFET 462 channel region. The PFET 462 is comprised of the gate 446P, S/D region 452P and channel region under the gate.

Non-Limiting Example Embodiments

The steps of the embodiments may be performed in any order and the embodiments are not limited to the order of the steps described above. For example, it may be possible to form the gate structures first, then form the S/D trenches, S/D stressor regions, S/D epitaxial layer and then complete the FET, etc.

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a semiconductor device comprising:
   providing a semiconductor substrate prepared with at least one trench having upper and lower portions;
   forming a stress layer in a lower portion of the trench, wherein the stress layer comprises a planar top surface in the lower portion, wherein the stress layer in the trench corresponds to a stressor region; and
   forming a semiconductor overlayer in the upper portion of the trench on the planar top surface of the stress layer, wherein the overlayer forms or substantially forms laterally from sides of the semiconductor substrate in upper portion of the trench, wherein the overlayer comprises a planar top surface which is coplanar with a top surface of the substrate.

2. The method of claim 1 wherein the substrate comprises silicon.

3. The method of claim 2 wherein the stress layer comprises an insulating material.

4. The method of claim 2 wherein fanning the overlayer comprises lateral epitaxy.

5. The method of claim 2 wherein the overlayer comprises Si, C doped Si, or SiGe.

6. The method of claim 1 wherein the substrate comprises a (110), (100) or (111) oriented substrate.

7. The method of claim 6 wherein the stress layer comprises an insulating material.

8. The method of claim 6 wherein forming the overlayer comprises lateral epitaxy.

9. The method of claim 8 wherein the overlayer comprises Si, C doped Si, or SiGe.

10. The method of claim 1 wherein forming the overlayer comprises lateral epitaxy, the overlayer comprises a top surface which is coplanar with the substrate.

11. The method of claim 1 wherein the stress layer comprises an insulating material.

12. The method of claim 1 wherein the stress layer comprises silicon nitride or silicon oxide.

13. The method of claim 1 wherein forming the stress layer in the lower portion comprises:
forming a stress inducing layer;
polishing the substrate to form a planar surface with the stress inducing layer and surface of the substrate; and
recessing the stress inducing layer to form the top surface of the stress layer below the surface of the substrate.

14. The method of claim 13 wherein:
forming the overlayer comprises lateral epitaxy; and
the overlayer comprises Si, C doped Si, or SiGe.

15. The method of claim 13 wherein recessing comprises a selective etch back process.

16. The method of claim 15 wherein forming the overlayer comprises lateral epitaxy.

17. The method of claim 1 wherein the stressor region is located below a channel region of a transistor, the stressor region comprises a first stress.

18. The method of claim 17 wherein the first stress comprises tensile stress and the transistor comprises a p-type transistor.

19. The method of claim 17 wherein the first stress comprises compressive stress and the transistor comprises a n-type transistor.

20. A semiconductor device comprising:
a semiconductor substrate having a trench with upper and lower portions;
a stress layer disposed in a lower portion of the trench, wherein the stress layer comprises a planar top surface in the lower portion of the trench; and
a lateral epitaxial overlayer disposed in the upper portion of the trench on the planar top surface of the stress layer, wherein the overlayer comprises a semiconductor material.

21. The semiconductor device of claim 20 wherein the substrate comprises silicon.

22. The semiconductor device of claim 21 wherein the stress layer comprises an insulating material.

23. The semiconductor device of claim 21 wherein the overlayer comprises Si, C doped Si, or SiGe.

24. The semiconductor device of claim 21 wherein the substrate comprises a (110), (100) or (111) oriented substrate.

25. The semiconductor device of claim 24 wherein the stress layer comprises an insulating material.

26. The semiconductor device of claim 24 wherein the overlayer comprises Si, C doped Si, or SiGe.

27. The semiconductor device of claim 20 wherein the overlayer comprises Si, C doped Si, or SiGe, the overlayer comprises a top surface which is coplanar with the substrate.

28. The semiconductor device of claim 20 wherein the stress layer comprises an insulating material.

29. The semiconductor device of claim 20 wherein the stress layer comprises silicon nitride or silicon oxide.

30. The semiconductor device of claim 20 wherein the stress layer in the trench corresponds to a stressor region, the stressor region is located below a channel region of a transistor, and the stressor region comprises a first stress.

31. The semiconductor device of claim 30 wherein the first stress comprises tensile stress and the transistor comprises a p-type transistor.

32. The semiconductor device of claim 30 wherein the first stress comprises compressive stress and the transistor comprises a n-type transistor.

* * * * *